(12) United States Patent
Trinh et al.

(10) Patent No.: US 9,647,207 B2
(45) Date of Patent: May 9, 2017

(54) RESISTIVE RANDOM ACCESS MEMORY (RRAM) STRUCTURE

(71) Applicant: Taiwan Semiconductor Manufacturing Co., Ltd., Hsin-Chu (TW)

(72) Inventors: Hai-Dang Trinh, Hsinchu (TW);
Chia-Shiung Tsai, Hsin-Chu (TW);
Chin-Wei Liang, Zhubei (TW);
Cheng-Yuan Tsai, Chu-Pei (TW);
Hsing-Lien Lin, Hsin-Chu (TW);
Chin-Chieh Yang, New Taipei (TW);
Wen-Ting Chu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 117 days.

(21) Appl. No.: 14/605,023

(22) Filed: Jan. 26, 2015

(65) Prior Publication Data
US 2016/0218283 A1 Jul. 28, 2016

(51) Int. Cl.
*H01L 45/00* (2006.01)

(52) U.S. Cl.
CPC .......... *H01L 45/08* (2013.01); *H01L 45/1233* (2013.01); *H01L 45/1253* (2013.01); *H01L 45/146* (2013.01); *H01L 45/1608* (2013.01); *H01L 45/1675* (2013.01)

(58) Field of Classification Search
CPC ... H01L 45/08; H01L 45/1608; H01L 45/146; H01L 45/1233
See application file for complete search history.

(56) References Cited

U.S. PATENT DOCUMENTS

| 8,872,149 B1 | 10/2014 | Hsieh et al. | |
| 2002/0024281 A1* | 2/2002 | Miyamoto | H01J 1/144 313/346 R |
| 2005/0029573 A1* | 2/2005 | Sato | H01L 27/105 257/314 |
| 2006/0131554 A1* | 6/2006 | Joung | G11C 13/0004 257/2 |
| 2008/0121864 A1* | 5/2008 | Seo | H01L 27/2436 257/4 |
| 2009/0289251 A1* | 11/2009 | Kiyotoshi | H01L 27/1021 257/43 |
| 2011/0037043 A1* | 2/2011 | Wada | G11C 13/0007 257/2 |

(Continued)

OTHER PUBLICATIONS

Wong, et al. "Metal-Oxide RRAM." Proceedings of the IEEE, vol. 100, No. 6, Jun. 2012.

*Primary Examiner* — Michele Fan
(74) *Attorney, Agent, or Firm* — Eschweiler & Potashnik, LLC (57) ABSTRACT

A resistive random access memory (RRAM) cell with a high κ layer based on a group-V oxide and hafnium oxide is provided. The RRAM cell includes a bottom electrode layer, a group-V oxide layer arranged over the bottom electrode layer, and a hafnium oxide based layer arranged over and abutting the group-V oxide layer. The RRAM cell further includes a capping layer arranged over and abutting the hafnium oxide based layer, and a top electrode layer arranged over the capping layer. A method for manufacturing the RRAM cell is also provided.

20 Claims, 9 Drawing Sheets

(56) References Cited

U.S. PATENT DOCUMENTS

| | | | |
|---|---|---|---|
| 2012/0223284 A1* | 9/2012 | Tamai | H01L 45/08 |
| | | | 257/4 |
| 2012/0295398 A1* | 11/2012 | Kurunczi | H01L 45/165 |
| | | | 438/104 |
| 2013/0153850 A1 | 6/2013 | Yabuhara et al. | |
| 2013/0187117 A1 | 7/2013 | Sandhu et al. | |
| 2014/0158967 A1* | 6/2014 | Hou | H01L 45/04 |
| | | | 257/4 |
| 2015/0016174 A1* | 1/2015 | Liu | H01L 27/11206 |
| | | | 365/96 |
| 2015/0083989 A1* | 3/2015 | Ode | H01L 45/04 |
| | | | 257/4 |

* cited by examiner

RESISTIVE RANDOM ACCESS MEMORY (RRAM) STRUCTURE

BACKGROUND

Many modern day electronic devices contain electronic memory. Electronic memory may be volatile memory or non-volatile memory. Non-volatile memory is able to store data in the absence of power, whereas volatile memory is not. Resistive random access memory (RRAM) is one promising candidate for next generation non-volatile memory due to its simple structure and its compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random access memory (RRAM) cell includes a data storage region (e.g., including a region of a high κ layer) and an ion reservoir region (e.g., including a region of the high κ layer and a capping layer) stacked between top and bottom electrodes. The data storage region includes a variable resistance that represents a unit of data, such as a bit of data. The ion reservoir region stores oxygen ions corresponding to oxygen vacancies, which facilitate resistance changes within the data storage region by defining one or more conductive filaments. For example, when oxygen ions move to the data storage region from the ion reservoir region, the oxygen ions fill oxygen vacancies breaking the conductive filaments and the variable resistance moves to a high resistance state. When oxygen ions move to the ion reservoir region from the data storage region, the oxygen ions leave oxygen vacancies and reform the conductive filaments. Upon reforming the conductive filaments, the variable resistance moves to a low resistance state.

The performance of an RRAM cell is often quantified in terms of one or more performance metrics, such as switching window, data retention, and endurance. The switching window of an RRAM cell is the difference between the resistances (or current flow at the readout voltage) of the data storage region in the high and low resistance states. The larger the switching window, the better the performance of the RRAM cell. The data retention of an RRAM cell is the amount of time the RRAM cell can store data. The higher the data retention period, the better the performance of the RRAM cell. The endurance of an RRAM cell is the number of set/reset cycles that an RRAM array can perform before violating a failure rate. For example, an RRAM cell can have an endurance of 10,000 set/reset cycles with a failure rate of less than 1%. The greater the endurance, the better the performance of the RRAM cell.

In designing an RRAM cell, it's often a tradeoff between different performance metrics. For example, RRAM cells employing hafnium oxide (HfO) based data storage regions often have good endurance, but poor data retention. Further, such RRAM cells often have small to non-existent switching windows due to large conductive filaments. As another example, RRAM cells employing group-V oxide based data storage regions often have good data retention, but poor endurance. Further, such RRAM cells often have small switching windows due to small filament sizes.

In view of the foregoing, the present application is directed to a RRAM cell having improved endurance and data retention, and an enlarged switching window, compared to RRAM cells with HfO based data storage regions and group-V oxide based data storage regions. The improved RRAM cell of the present application includes an ion reservoir region and a data storage region arranged between top and bottom electrodes. The ion reservoir region overlies and directly abuts the data storage region. Further, the ion reservoir region includes an upper region of a high κ layer (i.e., a layer with a dielectric constant κ exceeding 3.9), and a capping layer overlying and directly abutting the high κ layer. The high κ layer includes an HfO based layer arranged over and abutting a group-V oxide layer. The HfO based layer includes hafnium, oxide, and, in some embodiments, one or more additional elements. Similarly, the group-V oxide layer includes a group-V element, oxide, and, in some embodiments, one or more additional elements. The data storage region includes a lower region of the high κ layer underlying and abutting the upper region of the high κ layer. Typically, the lower region includes at least a region of the HfO based layer and the group-V oxide layer.

By employing both a HfO based layer and a group-V oxide layer for data storage, the improved RRAM cell advantageously has a larger switching window (e.g., 50-80% larger) compared to RRAM cells employing either an HfO based layer or a group-V oxide layer. Whereas these other RRAM cells have comparatively large or small filament sizes, the improved RRAM cell has both large and small filament sizes, that collectively act as a medium sized conductive filament. Further, the improved RRAM cell advantageously has improved endurance and data retention compared to RRAM cells employing either an HfO based layer or a group-V oxide layer.

Figure 1A:
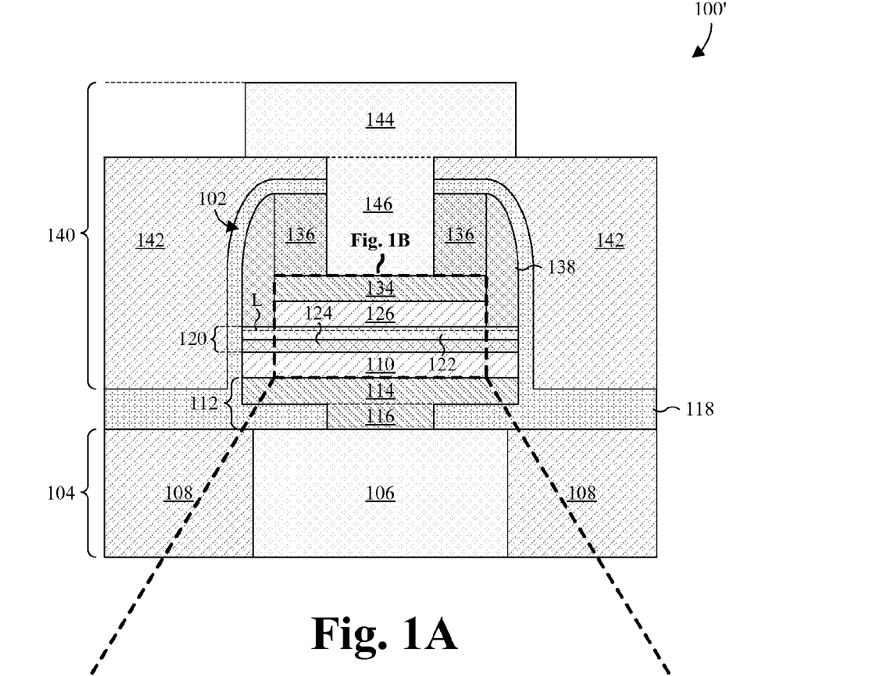
FIG. 1A illustrates a cross-sectional view of some embodiments of a semiconductor structure or integrated circuit including a resistive random access memory (RRAM) cell, the RRAM cell including a high κ layer based on a group-V oxide and hafnium oxide.

With reference to FIG. 1A, a cross-sectional view 100' is provided for some embodiments of a semiconductor structure or integrated circuit including a RRAM cell 102. The RRAM cell 102 is arranged over a semiconductor substrate (not shown) with a bottom interconnect structure 104 (partially shown) of a back-end-of-line (BEOL) metallization stack arranged between the RRAM cell 102 and the semiconductor substrate. The bottom interconnect structure 104 includes one or more bottom metallization layers 106 stacked within a bottom inter-layer dielectric (ILD) layer 108. The bottom ILD layer 108 may be, for example, an oxide or an extreme low-κ dielectric (i.e., a dielectric with a dielectric constant κ less than 2), and the bottom metallization layers 106 may be, for example, a metal, such as copper or tungsten.

A bottom electrode layer 110 of the RRAM cell 102 is arranged over the bottom interconnect structure 104. Further, the bottom electrode layer 110 is arranged in electrical communication with the bottom interconnect structure 104 through a diffusion barrier layer 112 of the RRAM cell 102 arranged between the bottom electrode layer 110 and the bottom interconnect structure 104. The diffusion barrier layer 112 prevents material from diffusing between the bottom interconnect structure 104 and the bottom electrode layer 110. The diffusion barrier layer 112 includes a top region 114 and a bottom region 116. The bottom region 116 includes a smaller footprint than the top region 114 and extends vertically down from the top region 114 to the bottom interconnect structure 104 through an insulating layer 118 encapsulating the RRAM cell 102. The bottom electrode layer 110 may be a conductive material, such as titanium nitride, tantalum nitride. The diffusion barrier layer 112 may be, for example, a conductive material, such as platinum, iridium, ruthenium or tungsten. The insulating layer 118 may be, for example, a dielectric material, such as silicon dioxide or silicon nitride.

A high κ layer 120 (i.e., a layer with a dielectric constant κ greater than 3.9) is arranged over the bottom electrode layer 110. The high κ layer 120 includes a HfO based layer 122 arranged over and abutting a group-V oxide layer 124. In some embodiments, the HfO based layer 122 is about 15-40 Angstroms, and/or the group-V oxide layer 124 is about 5-40 Angstroms. The HfO based layer 122 may be limited to hafnium and oxide (e.g., $HfO_2$), or may include hafnium, oxide, and one or more additional elements (e.g., hafnium silicon oxide (HfSiO), hafnium titanium oxide (HfTiO), hafnium tantalum oxide (HfTaO), or HfAlO). The group-V oxide layer 124 may be limited to a group-V element and oxide (e.g., niobium oxide (NbO), vanadium oxide (VO), or TaO), or may include a group-V element, oxide, and one or more additional elements (e.g., tantalum titanium oxide (TaTiO) or TaAlO).

A capping layer 126 is arranged over and abuts the HfO based layer 122 of the high κ layer 120. The capping layer 126 has a smaller footprint than the high κ layer 120, and a lower concentration of oxygen than the high κ layer 120. Due to the lower concentration of oxygen in the capping layer 126, the capping layer 126 reacts with the high κ layer 120 to extract oxygen from the high κ layer 120. The depth to which oxygen is extracted from the high κ layer 120 bisects the high κ layer 120 into upper and lower regions (demarcated by a dashed line L), and varies depending upon the thickness and material of the capping layer 126. Typically, however, the depth is limited to the HfO based layer 122. The capping layer 126 may be, for example, a metal or a metal oxide, such as titanium, hafnium, tantalum, or aluminum.

Figure 1B:
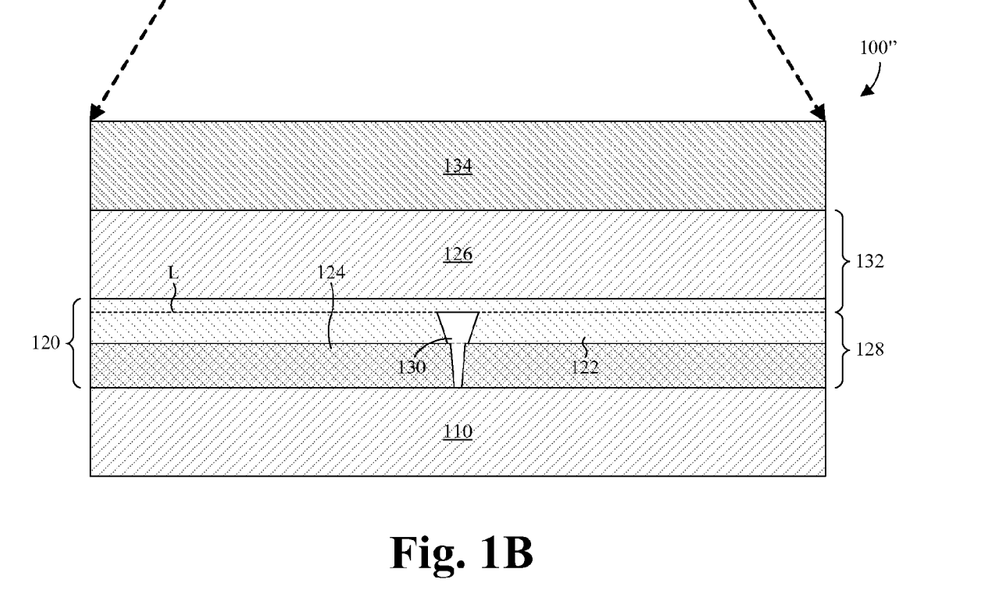
FIG. 1B illustrates an enlarged, cross-sectional view of some embodiments of the high κ layer of FIG. 1A.

With reference to FIG. 1B, an enlarged, cross-sectional view 100'' of some embodiments the semiconductor structure or integrated circuit of FIG. 1A is provided. The lower region of the high κ layer 120 defines a data storage region 128 of the RRAM cell 102. The data storage region 128 has a variable resistance representing a unit of data, such as a bit of data. The variable resistance varies between comparatively low and high resistance states depending upon whether one or more conductive filaments 130 of the data storage region 128 are opened or partially closed. For example, the variable resistance is in a low resistance state when the conductive filaments 130 are opened, and the variable resistance is in a comparatively high resistance state when the conductive filaments 130 are partially closed. The conductive filaments 130 extend between top and bottom surfaces of the data storage region 128, and correspond to oxygen vacancies aligned between the top and bottom surfaces of the data storage region 128. In some embodiments, the conductive filaments 130 extend from about even with a top surface of the data storage region 128 to about even with a bottom surface of the data storage region 128. In other embodiments, the conductive filaments 130 extend from about even with a top surface of the high κ layer 120 to about even with a bottom surface of the high κ layer 120. The conductive filaments 130 include upper and lower regions demarcated by the interface between the HfO based layer 122 and the group-V oxide layer 124.

The capping layer 126 and the upper region of the high κ layer 120 collectively define an ion reservoir region 132 of the RRAM cell 102 overlying and abutting the data storage region 128. The ion reservoir region 132 stores oxygen ions to facilitate resistance changes within the data storage region 128. Resistance changes are typically performed through application of a voltage across the ion reservoir and data storage regions 128, 132 to move oxygen ions between the ion reservoir and data storage regions 128, 132. When a reset voltage (e.g., a high negative voltage relative to a readout voltage) is applied, oxygen ions move from the ion reservoir region 132 to the data storage region 128, thereby combining with the oxygen vacancies of the conductive filaments 130 and partially breaking the conductive filaments (such that the conductive filaments are partially formed). This recombination starts with the lower regions of the conductive filaments 130 and moves towards the upper regions of the conductive filaments 130. When a set voltage (e.g., a high positive voltage relative to the readout voltage) is applied, oxygen ions move from the data storage region 128 to the ion reservoir region 132, thereby forming oxygen vacancies that form the conductive filaments 130.

The upper regions of the conductive filaments 130 tend to have larger footprints than the lower regions of the conductive filaments 130. For example, the HfO based layer 122 may allow for a conductive filament to be formed having a first width, while the group-V oxide layer 124 may allow for a conductive filament to be formed having a second width smaller than the first width. The larger conductive filament in the HfO based layer 122 provides for a high current for high and low data states, which causes a small switching window between data states. Similarly, the small conductive filament in the group-V oxide layer 124 provides for a low current for high and low data states, which also causes a small switching window between data states. By employing both a HfO based layer 122 and a group-V oxide layer 124 for data storage, the RRAM cell 102 combines the large filament size of HfO based RRAM cells (corresponding to the upper regions of the conductive filaments 130) with the small filament size of the group-V oxide based RRAM cells (corresponding to the lower regions of the conductive filaments 130). The large and small filament sizes collectively act as a medium filament size, which advantageously provides for a larger switching window (e.g., 50-80% larger) than RRAM cells employing one or the other of an HfO based layer and a group-V oxide layer.

Further, the group-V oxide layer 124 provides for better retention than the HfO based layer 122, while the HfO based layer 122 provides for better endurance than the group-V oxide layer 124. By employing both a HfO based layer 122 and a group-V oxide layer 124 for data storage, the RRAM cell 102 advantageously has an improved combination of endurance and data retention compared to RRAM cells employing one or the other of an HfO based layer and a group-V oxide layer. Where the HfO based layer 122 is limited to hafnium and oxide, the RRAM cell 102 improves upon the endurance of HfO and group-V based RRAM cells, and where the HfO based layer 122 includes hafnium, oxide, and one or more additional elements, such as HfTaO, the RRAM cell 102 even further improves upon the endurance of HfO and group-V based RRAM cells.

Referring back to FIG. 1A, a top electrode layer 134 of the RRAM cell 102 is arranged over the capping layer 126, and a hard mask layer 136 of the RRAM cell 102 is arranged over the capping layer 126. The hard mask layer 136 is residual material from the manufacture of the RRAM cell 102. The top electrode layer 134 may be, for example, a conductive material, such as doped polysilicon, titanium nitride, tantalum nitride, platinum, iridium, or tungsten. Further, the hard mask layer 136 may be, for example, a dielectric, such as silicon dioxide or silicon nitride.

In some embodiments, a sidewall spacer layer 138 of the RRAM cell 102 surrounds the capping layer 126, the hard mask layer 136, and the top electrode layer 134 along sidewalls of the capping layer 126, the hard mask layer 136, and the top electrode layer 134. The sidewall spacer layer 138 prevents leakage between the top and bottom electrode layers 110, 134 and is used during the manufacture of the RRAM cell 102 to define a foot print of the bottom electrode layer 110, the high κ layer 120, and the diffusion barrier layer 112. The sidewall spacer layer 138 may be, for example, silicon nitride or a multilayer oxide-nitride-oxide film.

A top interconnect structure 140 of the BEOL metallization stack is arranged over the bottom interconnect structure 104. The top interconnect structure 140 includes a top ILD layer 142 surrounding the insulating layer 118 and a top metallization layer 144 overlying a top ILD layer 142. Further, the top interconnect structure includes a via 146 extending from the top metallization layer 144 to the top electrode layer 134 through the top ILD layer 142, the insulating layer 118 and the hard mask layer 136 to electrically connect the top electrode layer 134 to the top metallization layer 144. The top ILD layer 142 may be, for example, an oxide or an extreme low-K dielectric, and the top metallization layer 144 and the via 146 may be, for example, a metal, such as copper, aluminum, or tungsten.

Figure 2:
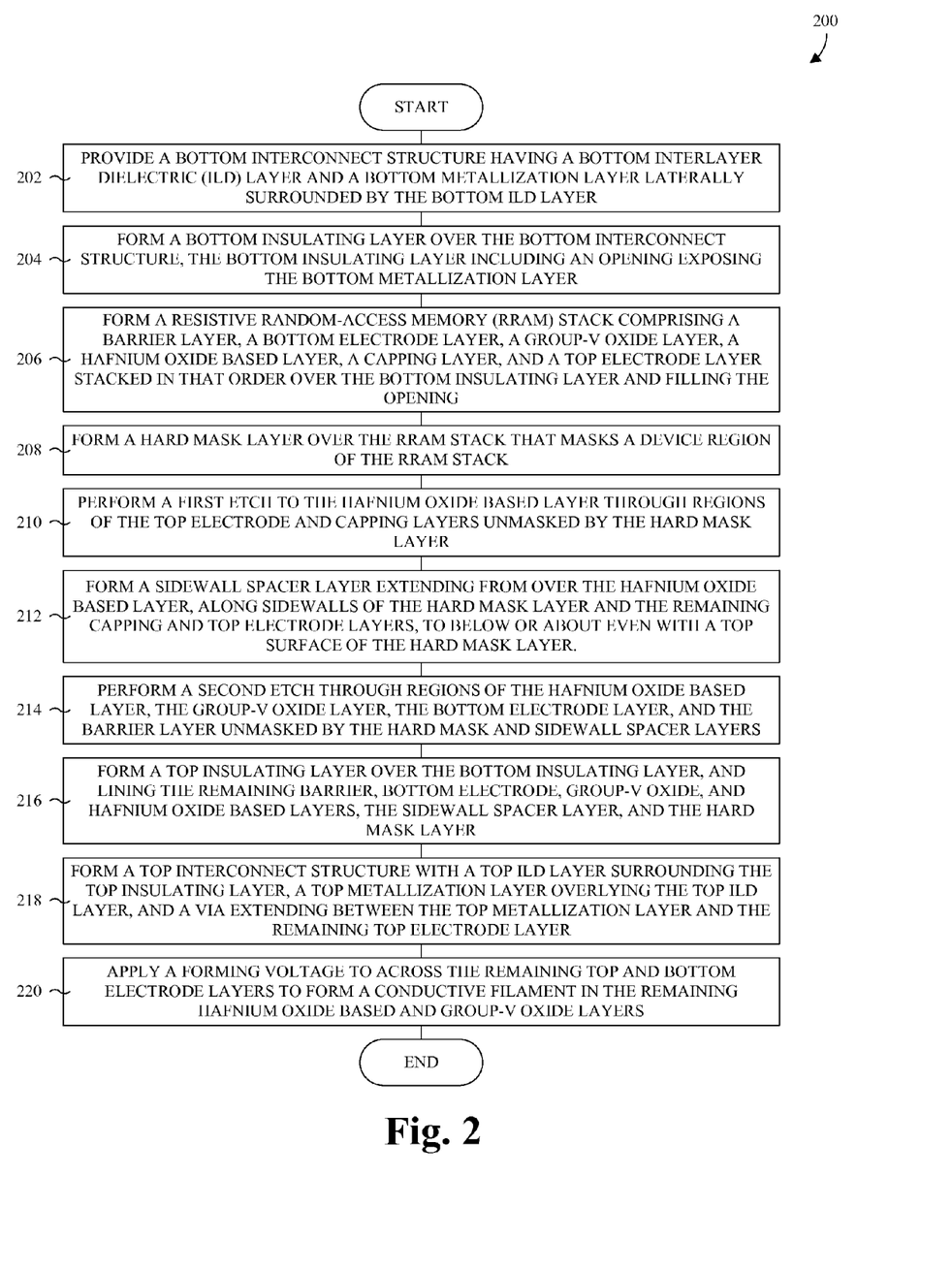
FIG. 2 illustrates a flowchart of some embodiments of a method for manufacturing a semiconductor structure or integrated circuit including a RRAM cell, the RRAM cell including a high κ layer based on a group-V oxide and hafnium oxide.

With reference to FIG. 2, a flowchart 200 provides some embodiments of a method for manufacturing a semiconductor structure or integrated circuit of a RRAM cell with a high κ layer based on a group-V oxide and hafnium oxide.

As 202, a bottom interconnect structure having a bottom ILD layer and a bottom metallization layer laterally surrounded by the bottom ILD layer is provided.

At 204, a bottom insulating layer is formed over the bottom interconnect structure. The bottom insulating layer includes an opening exposing the bottom metallization layer.

At 206, a RRAM stack is formed. The RRAM stack includes a barrier layer, a bottom electrode layer, a group-V oxide layer, a hafnium oxide based layer, a capping layer, and a top electrode layer stacked in that order over the bottom insulating layer and filling the opening.

At 208, a hard mask layer is formed over the RRAM stack, and masking a device region of the RRAM stack.

At 210, a first etch is performed to etch the top electrode layer and the capping layer according to the hard mask layer. The first etch ends on the hafnium oxide based layer.

At 212, a sidewall spacer layer is formed extending from over the hafnium oxide based layer, along sidewalls of the remaining capping and top electrode layers and the hard mask layer, to below or about even with a top surface of the hard mask layer.

At 214, a second etch is performed through regions of the hafnium oxide based layer, the group-V oxide layer, the bottom electrode layer, and the barrier layer unmasked by the hard mask layer and the sidewall spacer layer.

At 216, a top insulating layer is formed over the bottom insulating layer, and lining the remaining barrier, bottom electrode, group-V oxide, and hafnium oxide based layers, the sidewall spacer layer, and the hard mask layer.

At 218, a top interconnect structure is formed. The top interconnect structure includes a top ILD layer surrounding the top insulating layer, a top metallization layer overlying the top ILD layer, and a via extending between the top metallization layer and the remaining top electrode layer.

At 220, a forming voltage is applied across the remaining top and bottom electrode layers to form a conductive filament in the remaining hafnium oxide based and group-V oxide layers.

While the disclosed method (e.g., the method described by the flowchart 200) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-16, cross-sectional views of some embodiments of a semiconductor structure or integrated circuit of a RRAM cell at various stages of manufacture are provided to illustrate the method of FIG. 2. Although FIGS. 3-16 are described in relation to the method, it will be appreciated that the structures disclosed in FIGS. 3-16 are not limited to the method, but instead may stand alone as structures independent of the method. Similarly, although the method is described in relation to FIGS. 3-16, it will be appreciated that the method is not limited to the structures disclosed in FIGS. 3-16, but instead may stand alone independent of the structures disclosed in FIGS. 3-16.

Figure 3:
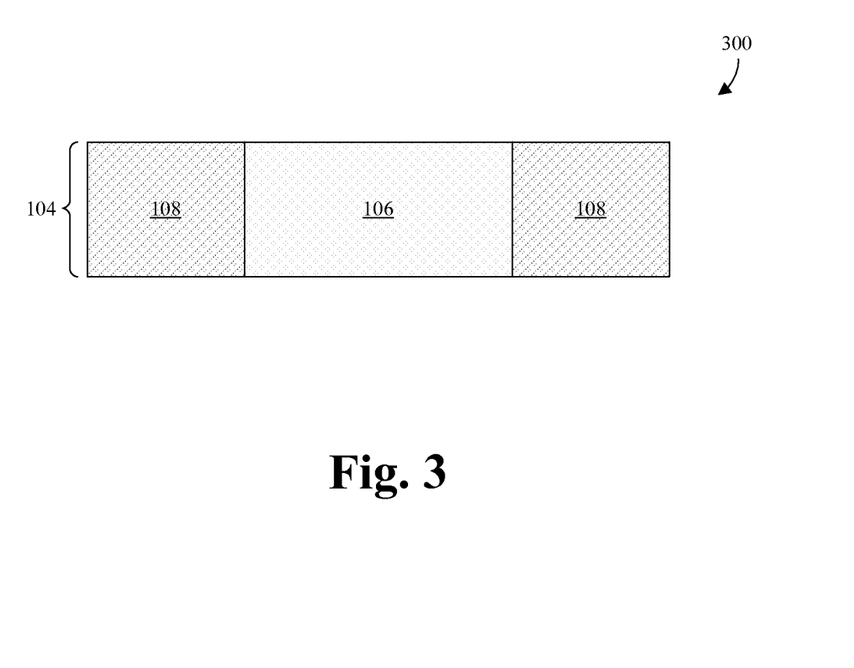
FIGS. 3-16 illustrate a series of cross-sectional views of some embodiments of a semiconductor structure or integrated circuit at various stages of manufacture, the semiconductor structure or integrated circuit including a RRAM cell with a high κ layer based on a group-V oxide and hafnium oxide.

FIG. 3 illustrates a cross-sectional view 300 of some embodiments corresponding to Act 202.

As illustrated by FIG. 3, a bottom interconnect structure 104 (partially shown) is provided. The bottom interconnect structure 104 includes a bottom metallization layer 106 laterally surrounded by a bottom ILD layer 108. The bottom ILD layer 108 may be, for example, an extreme low-κ dielectric, and the bottom metallization layer 106 may be, for example, a metal, such as copper or tungsten.

Figure 4:
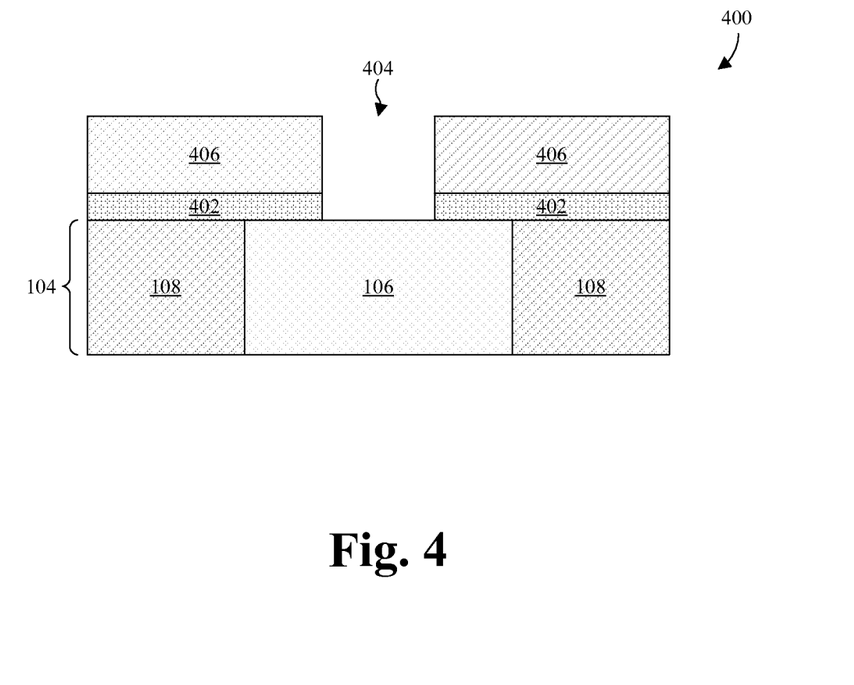

FIG. 4 illustrates a cross-sectional view 400 of some embodiments corresponding to Act 204.

As illustrated by FIG. 4, a bottom insulating layer 402 is formed over the bottom interconnect structure 104 with a first opening 404 exposing the bottom metallization layer 106.

The bottom insulating layer 402 may be, for example, a dielectric, such as silicon dioxide or silicon nitride. In some embodiments, the process for forming the bottom insulating layer 402 includes: depositing an intermediate insulating layer over the bottom interconnect structure 104; forming a photoresist layer over the intermediate insulating layer; patterning the photoresist layer to mask regions of the intermediate insulating layer surrounding the first opening region of the intermediate insulating layer; applying one or more etchants selective of the intermediate insulating layer, but not the patterned photoresist layer 406, for a period of time sufficient to etch to the bottom interconnect structure 104; and removing the patterned photoresist layer 406.

Figure 5:
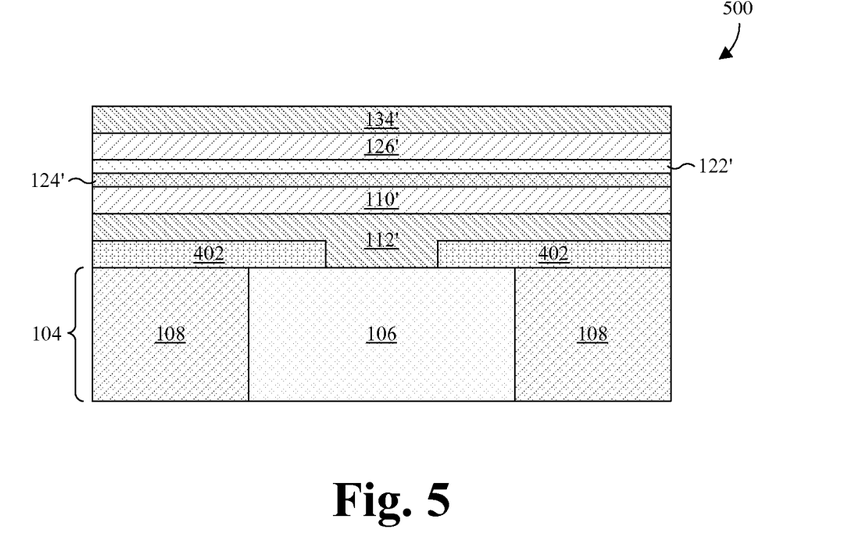

FIG. 5 illustrates a cross-sectional view 500 of some embodiments corresponding to Act 206.

As illustrated by FIG. 5, a RRAM stack is formed over the bottom insulating layer 402 and filling the first opening 404. The RRAM stack is formed by forming a diffusion barrier layer 112' over the bottom insulating layer 402 and filling the first opening 404. The diffusion barrier layer 112' may be, for example, a conductive material, such as polysilicon, titanium nitride, tantalum nitride, platinum, gold, iridium, ruthenium or tungsten.

After forming the diffusion barrier layer 112', a bottom electrode layer 110', a group-V oxide layer 124', a HfO based layer 122', a capping layer 126', and a top electrode layer 134' are sequentially formed in that order. The bottom electrode layer 110' and the top electrode layer 134' may be, for example, a conductive material, such as doped polysilicon, titanium nitride, tantalum nitride, platinum, iridium, ruthenium or tungsten. The group-V oxide layer 124' may be, for example, limited to a group-V oxide, such as TaO, or a derivative of a group-V oxide, such as TaTiO. The HfO based layer 122' may be, for example, limited to HfO or a derivative of HfO, such as HfTiO. The capping layer 126' may be, for example, a metal or a metal oxide, such as titanium, hafnium, tantalum, or aluminum.

Figure 6:
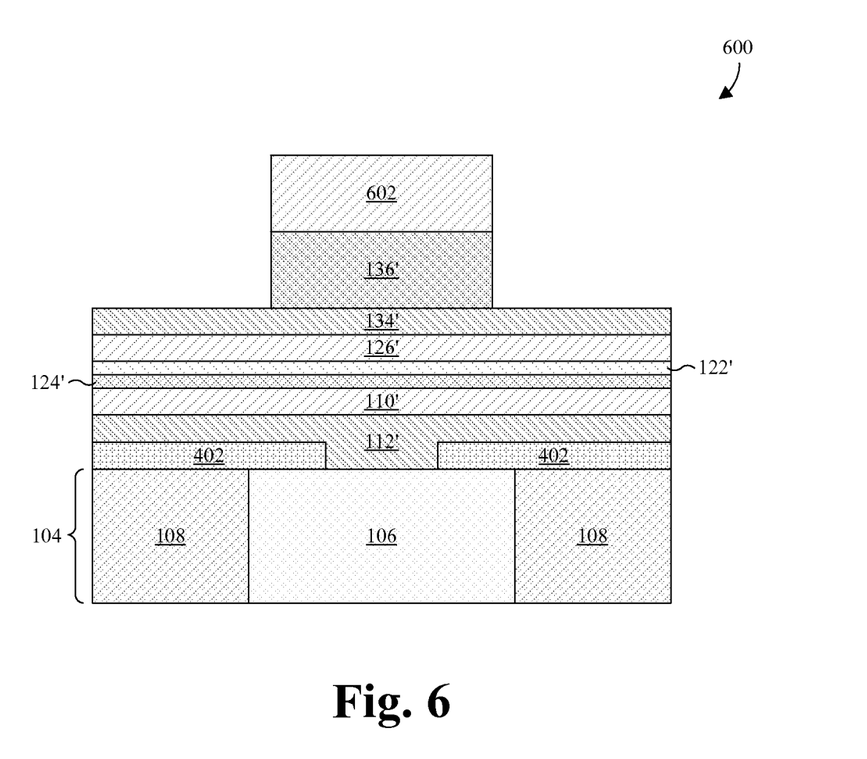

FIG. 6 illustrates a cross-sectional view 600 of some embodiments corresponding to Act 208.

As illustrated by FIG. 6, a hard mask layer 136' is formed masking a device region of the RRAM stack. The hard mask layer 136' may be, for example, a dielectric, such as silicon dioxide or silicon nitride. In some embodiments, the process for forming the hard mask layer 136' includes: forming an intermediate hard mask layer over the RRAM stack; forming a photoresist layer over the intermediate hard mask layer; patterning the photoresist layer to mask the device region of the MRAM stack; performing an etch into the intermediate hard mask layer according to the patterned photoresist layer 602; and removing the patterned photoresist layer 602.

Figure 7:
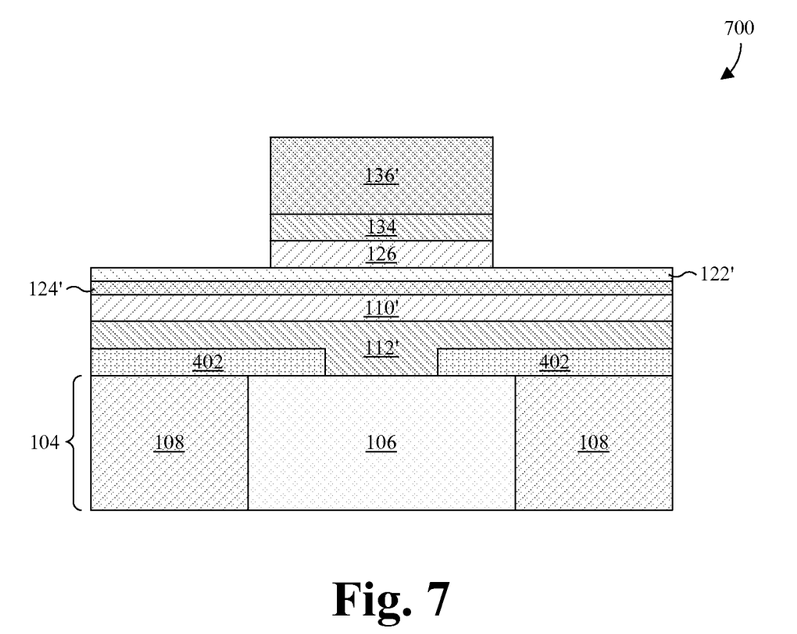

FIG. 7 illustrates a cross-sectional view 700 of some embodiments corresponding to Act 210.

As illustrated by FIG. 7, a first etch is performed to the HfO based layer 122' through regions of the top electrode layer 134' and the capping layer 126' unmasked by the hard mask layer 136'. In some embodiments, the process for performing the first etch includes applying one or more etchants selective the top electrode layer 134' and the capping layer 126', relative to the HfO based layer 122' and/or the hard mask layer 136', for a period of time sufficient to etch to the HfO based layer 122'.

Figure 8:
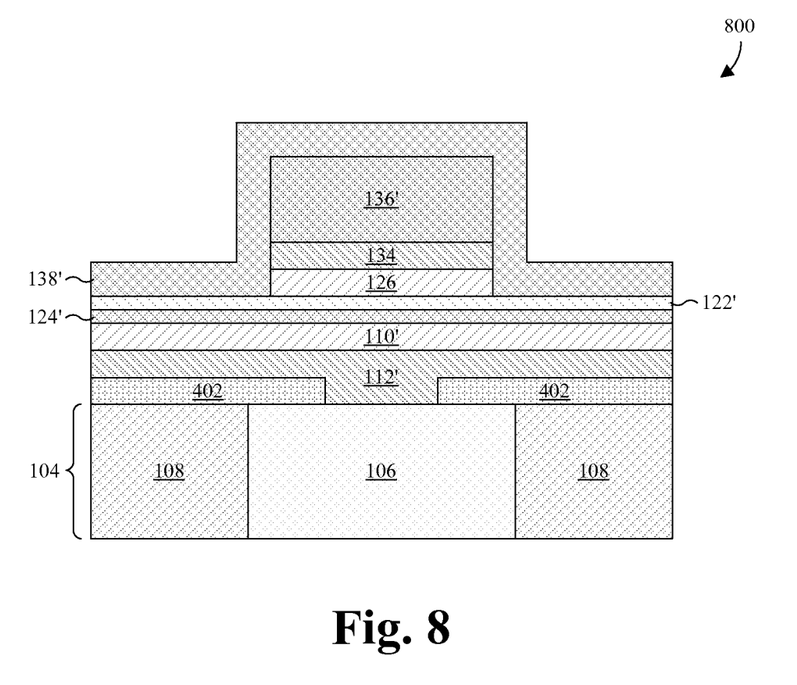
Figure 9:
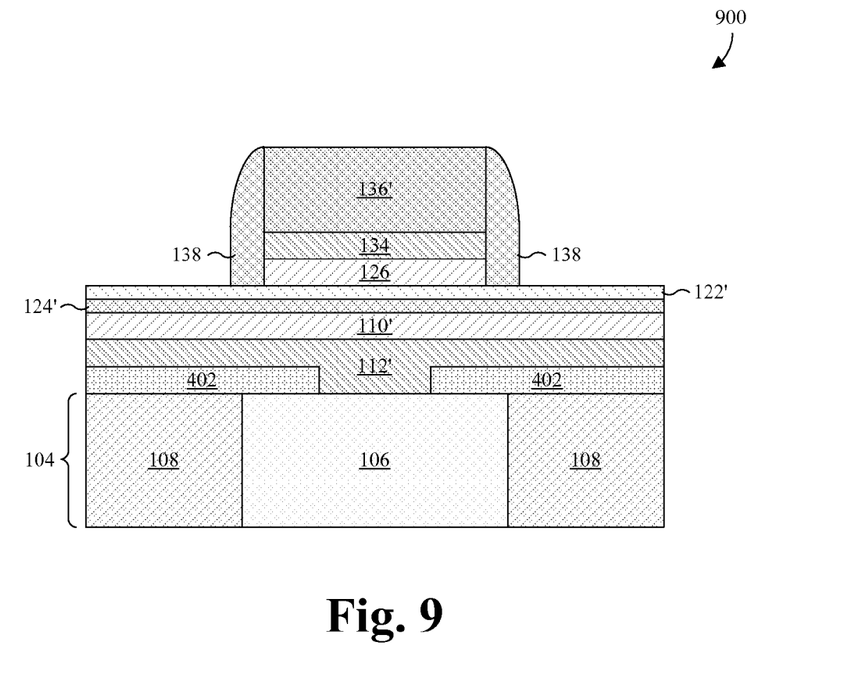

FIGS. 8 and 9 illustrate cross-sectional views 800, 900 of some embodiments corresponding to Act 212.

As illustrated by FIG. 8, a sidewall spacer layer 138' is formed over the HfO based layer 122', and lining the remaining capping and top electrode layers 126, 134 and the hard mask layer 136'. The sidewall spacer layer 138' is typically formed conformally. Further, the sidewall spacer layer 138' may be, for example, silicon nitride or a multi-layer oxide-nitride-oxide film.

As illustrated by FIG. 9, an etch back is performed to etch the sidewall spacer layer 138' back to below or about even with the top surface of the hard mask layer 136'. In performing the etch back, lateral stretches of the sidewall spacer layer 138' are removed to expose the top surface of the hard mask layer 136' and the top surface of the HfO based layer 122'. In some embodiments, the process for performing the etch back includes exposing the sidewall spacer layer 138' to an etchant for a period of time sufficient to etch through the thickness of the sidewall spacer layer 138'.

Figure 10:
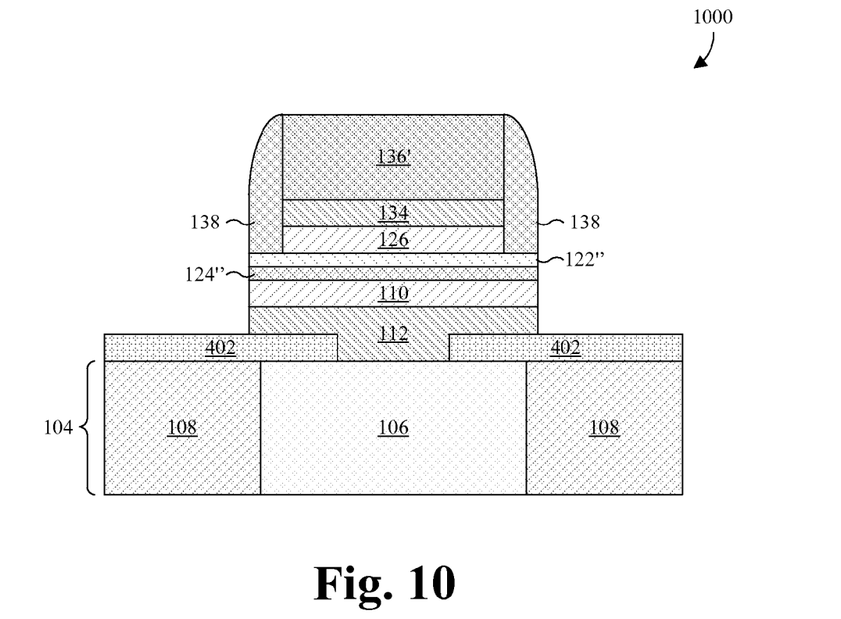

FIG. 10 illustrates a cross-sectional view 1000 of some embodiments corresponding to Act 214.

As illustrated by FIG. 10, a second etch is performed to the bottom insulating layer 402 through regions of the HfO based layer 122', the group-V oxide layer 124', the bottom electrode layer 110, and the diffusion barrier layer 112' unmasked by the hard mask layer 136' and the remaining sidewall spacer layer 138. In some embodiments, the process for performing the second etch includes applying one or more etchants selective of the HfO based layer 122', the group-V oxide layer 124', the bottom electrode layer 110, and the diffusion barrier layer 112', relative to the hard mask layer 136' and the remaining sidewall spacer layer 138, for a period of time sufficient to etch to the bottom insulating layer 402.

Figure 11:
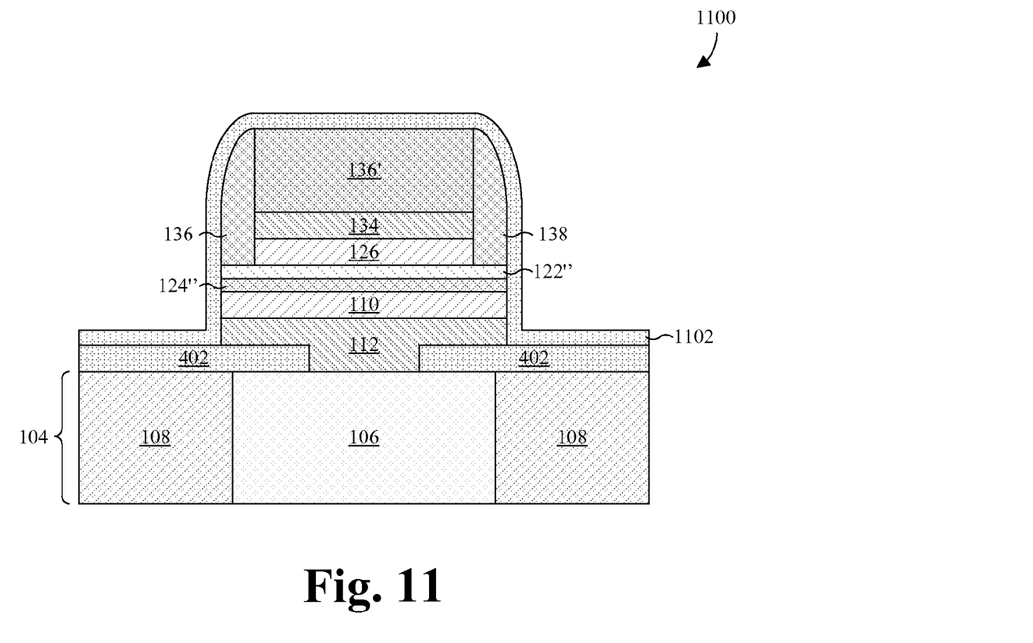

FIG. 11 illustrates a cross-sectional view 1100 of some embodiments corresponding to Act 216.

As illustrated by FIG. 11, a top insulating layer 1102 is formed over the bottom insulating layer 402, and lining the remaining barrier, bottom electrode, group-V oxide, HfO based, and sidewall spacer layers 112, 110, 122", 124", 138 and the hard mask layer 136'. The top insulating layer 1102 may be, for example, a dielectric material, such as silicon dioxide or silicon nitride. In some embodiments, the process for forming the top insulating layer 1102 includes a conformal deposition.

FIGS. 12-15 illustrate cross-sectional views 1200, 1300, 1400, 1500 of some embodiments corresponding to Act 218.

Figure 12:
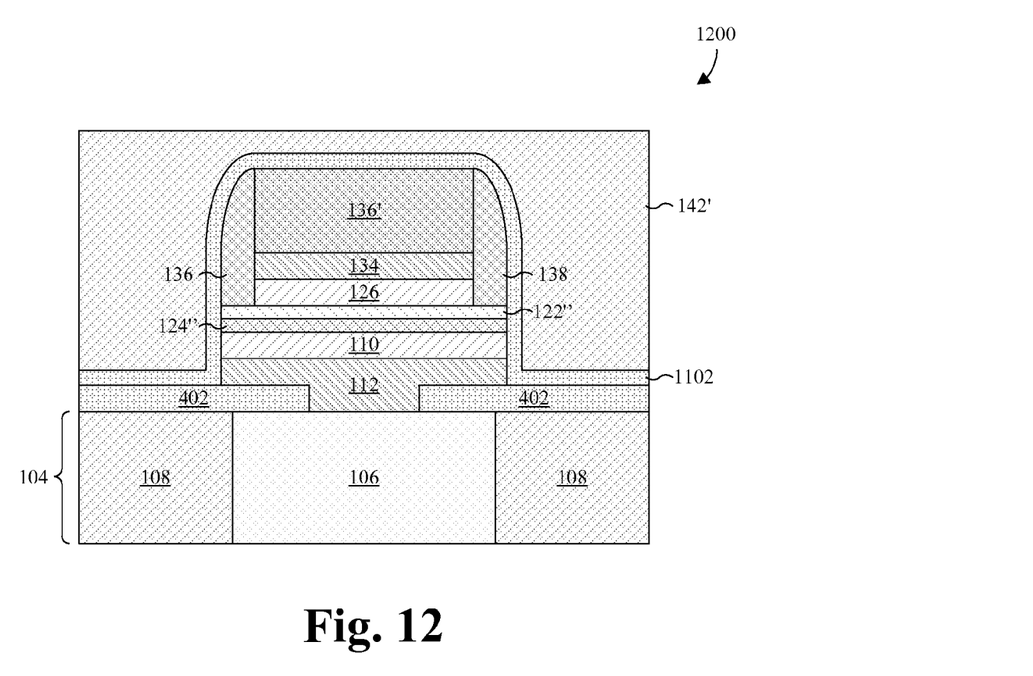

As illustrated by FIG. 12, a top ILD layer 142' is formed over and surrounding the top insulating layer 1102. The top ILD layer 142' may be, for example, an extreme low-K dielectric. In some embodiments, the process for forming top ILD layer 142' includes depositing an intermediate ILD layer and performing a chemical mechanical polish (CMP) into the intermediate ILD layer to planarize the top surface of the intermediate ILD layer.

Figure 13:
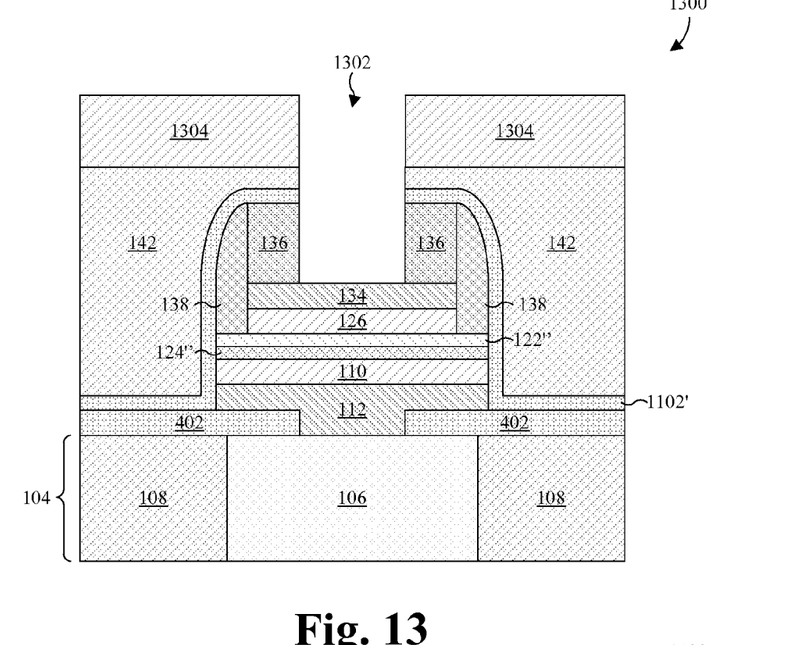

As illustrated by FIG. 13, a third etch is performed to the remaining top electrode layer 134 through a via region of the top ILD layer 142', the top insulating layer 1102, and the hard mask layer 136' to form a second opening 1302 exposing the remaining top electrode layer 134. The process for performing the third etch may include: forming a photoresist layer over the top ILD layer 142'; patterning the photoresist layer to mask regions of the top ILD layer 142' surrounding the via region; applying one or more etchants selective of the top ILD layer 142', the top insulating layer 1102, and the hard mask layer 136', but not the patterned photoresist layer 1304, for a period of time sufficient to etch to the remaining top electrode layer 134; and removing the patterned photoresist layer 1304.

Figure 14:
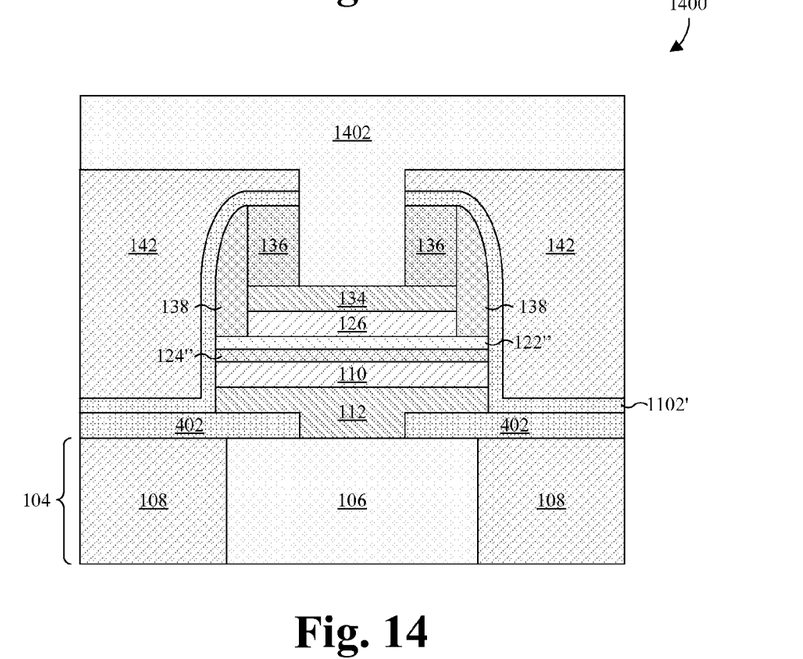

As illustrated by FIG. 14, a conductive layer 1402 is formed over the remaining top ILD layer 142 and the remaining top insulating layer 1102', and filling the second opening 1302. The conductive layer 1402 may be, for example, a metal, such as copper or tungsten.

Figure 15:
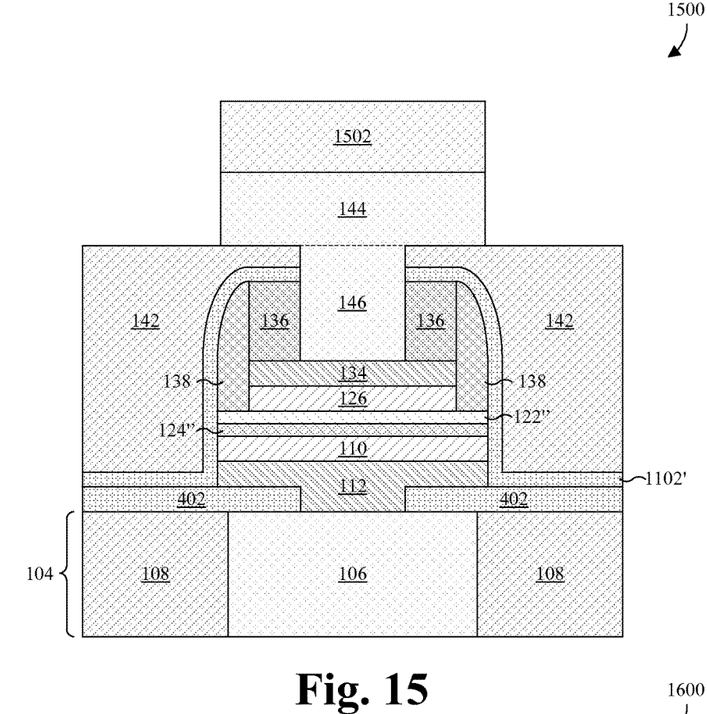

As illustrated by FIG. 15, a fourth etch is performed through select regions of the conductive layer 1402 to form a top metallization layer 144 over the remaining top ILD layer 142 and a via 146 extending between the top metallization layer 144 and the remaining top electrode layer 134. The process for performing the fourth etch may include: forming a photoresist layer over the conductive layer 1402; patterning the photoresist layer to define a pattern of the top metallization layer 144; applying one or more etchants selective of the conductive layer 1402, but not the patterned photoresist layer 1502, for a period of time sufficient to etch to the remaining top ILD layer 142; and removing the patterned photoresist layer 1502.

Figure 16:
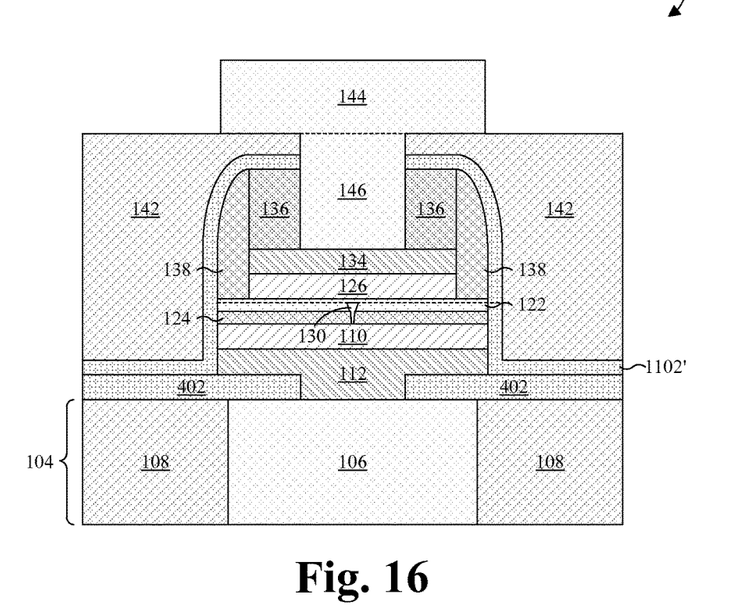

FIG. 16 illustrates a cross-sectional view 1600 of some embodiments corresponding to Act 220.

As illustrated by FIG. 16, a forming voltage is applied to the remaining top and bottom electrode layers 110, 134 to form one or more conductive filaments 130 in the remaining HfO based and group-V oxide layers 122", 124". The forming voltage is typically high so as to promote the migration of oxygen ions in the HfO based and group-V oxide layers 122", 124" toward the top electrode layer 134. Based on the migration, oxygen vacancies align in the HfO based and group-V oxide layers 122", 124" to form the conductive filaments 130.

Thus, as can be appreciated from above, the present disclosure provides a RRAM cell. The RRAM cell includes a bottom electrode layer, and a group-V oxide layer arranged over the bottom electrode layer. Further, the RRAM cell includes a hafnium oxide based layer arranged over and abutting the group-V oxide layer, a capping layer arranged over and abutting the hafnium oxide based layer, and a top electrode layer arranged over the capping layer.

In other embodiments, the present disclosure provides a method for manufacturing a RRAM cell. A RRAM stack is formed. The RRAM stack includes a bottom electrode layer, a group-V oxide layer, a hafnium oxide based layer, a capping layer, and a top electrode layer stacked in that order. A hard mask layer is formed masking a device region of the RRAM stack. A first etch of the top electrode layer and the capping layer is performed according to the hard mask layer. The first etch extends to the hafnium oxide based layer. A second etch of the bottom electrode layer, the group-V oxide layer, and the hafnium oxide based layer is performed.

In yet other embodiments, the present disclosure provides an integrated circuit of a RRAM cell. The integrated circuit includes a bottom electrode layer and a high κ layer. The high κ layer has a variable resistance and a dielectric constant exceeding 3.9. Further, the high κ layer includes a group-V oxide and a hafnium oxide based layer. The group-V oxide layer is arranged over the bottom electrode layer, and the hafnium oxide based layer abuts the group-V oxide layer. The integrated circuit further includes a capping layer arranged over the hafnium oxide based layer, and a top electrode layer arranged over the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) cell comprising:
   a bottom electrode layer;
   a group-V oxide layer arranged over the bottom electrode layer;
   a hafnium oxide based layer arranged over and abutting the group-V oxide layer;
   a capping layer arranged over and abutting the hafnium oxide based layer;
   a top electrode layer arranged over the capping layer; and
   a fully or partially formed conductive filament arranged within the hafnium oxide and group-V oxide layers, and extending from the group-V oxide layer into the hafnium oxide based layer, wherein the conductive filament includes an upper region and a lower region demarcated by an interface between the hafnium oxide and group-V oxide layers, and wherein the lower region has a smaller footprint than the upper region.

2. The RRAM cell according to claim 1, wherein the hafnium oxide based layer is bisected into an upper region and a lower region, and wherein the RRAM cell further includes:
   a data storage region comprising the group-V oxide layer and the lower region of the hafnium oxide based layer, and configured to vary in resistance in response to external electric fields; and
   an ion reservoir including the capping layer and the upper region of the hafnium oxide based layer, and configured to store oxygen ions from the data storage region.

3. The RRAM cell according to claim 1, wherein the capping layer has a lower concentration of oxygen than the hafnium oxide based layer, and is configured to extract oxygen from the hafnium oxide based layer.

4. The RRAM cell according to claim 1, wherein the group-V oxide layer is one of tantalum oxide, niobium oxide, vanadium oxide, tantalum titanium oxide, and tantalum aluminum oxide.

5. The RRAM cell according to claim 1, wherein the hafnium oxide based layer consists of hafnium and oxide.

6. The RRAM cell according to claim 1, wherein the hafnium oxide based layer includes hafnium, oxide, and one or more additional elements.

7. The RRAM cell according to claim 1, wherein the hafnium oxide based layer includes one or more of hafnium aluminum oxide, hafnium silicon oxide, hafnium titanium oxide, and hafnium tantalum oxide.

8. The RRAM cell according to claim 1, wherein the hafnium oxide based layer is about 15-40 Angstroms thick, and wherein the group-V oxide layer is about 5-40 Angstroms thick.

9. A method for manufacturing a resistive random access memory (RRAM) cell, the method comprising:
forming a RRAM stack comprising a bottom electrode layer, a group-V oxide layer, a hafnium oxide based layer, a capping layer, and a top electrode layer stacked in that order;
forming a hard mask layer masking a device region of the RRAM stack;
performing a first etch of the top electrode layer and the capping layer according to the hard mask layer, wherein the first etch extends to the hafnium oxide based layer;
forming a sidewall spacer layer over the hafnium oxide based layer, and lining the remaining to electrode and capping layers and the hard mask layer; and
performing a second etch of the bottom electrode layer, the group-V oxide layer, and the hafnium oxide based layer according to the hard mask layer and the sidewall spacer layer.

10. The method according to claim 9, further including:
forming the hafnium oxide based layer over and abutting the group-V oxide layer; and
forming the capping layer over and abutting the hafnium oxide based layer.

11. The method according to claim 9, further including:
applying a forming voltage across the top and bottom electrode layers to form a conductive filament within the hafnium oxide based and group-V oxide layers, and extending from the group-V oxide layer into the hafnium oxide based layer, wherein the conductive filament includes an upper region and a lower region demarcated by an interface between the hafnium oxide based and group-V oxide layers, and wherein the lower region has a smaller footprint than the upper region.

12. The method according to claim 9, further including:
forming the capping layer with a lower concentration of oxygen than the hafnium oxide based layer.

13. The method according to claim 9, further including:
forming the group-V oxide layer from one of tantalum oxide, niobium oxide, vanadium oxide, tantalum titanium oxide, and tantalum aluminum oxide.

14. The method according to claim 9, further including:
forming the hafnium oxide based layer with hafnium, oxide, and one or more additional elements.

15. The method according to claim 9, further including:
forming the hafnium oxide based layer from one or more of hafnium aluminum oxide, hafnium silicon oxide, hafnium titanium oxide, and hafnium tantalum oxide.

16. The method according to claim 9, further including:
forming the hafnium oxide based layer with a thickness of about 15-40 Angstroms; and
forming the group-V oxide layer with a thickness of about 5-40 Angstroms.

17. The method according to claim 9, further including:
forming an insulating layer lining the remaining bottom electrode, group-V oxide, and hafnium oxide layers and the hard mask layer;
forming an interlayer dielectric (ILD) layer over and around the insulating layer; and
forming a metallization layer over the ILD layer and a via extending between the remaining top electrode layer and the metallization layer.

18. An integrated circuit of a resistive random access memory (RRAM) cell, the integrated circuit comprising:
a bottom electrode layer;
a high κ layer with a variable resistance and a dielectric constant exceeding 3.9, wherein the high κ layer includes:
a group-V oxide layer arranged over the bottom electrode layer; and
a hafnium oxide based layer arranged over and abutting the group-V oxide layer, wherein the hafnium oxide based layer is bisected into an upper region and a lower region;
a capping layer arranged over and abutting the hafnium oxide based layer;
a top electrode layer arranged over the capping layer;
a data storage region comprising the group-V oxide layer and the lower region, and configured to vary in resistance in response to external electric fields; and
an ion reservoir including the capping layer and the upper region, and configured to store oxygen ions from the data storage region.

19. The integrated circuit according to claim 18, further comprising:
a conductive filament arranged within the hafnium oxide and group-V oxide layers, and extending from the group-V oxide layer into the hafnium oxide based layer, wherein the conductive filament includes an upper region and a lower region demarcated by an interface between the hafnium oxide and group-V oxide layers, and wherein the lower region of the conductive filament has a smaller footprint than the upper region of the conductive filament.

20. The integrated circuit according to claim 18, wherein the capping layer has a lower concentration of oxygen than the hafnium oxide based layer, and is configured to extract oxygen from the hafnium oxide based layer.

* * * * *